United States Patent
Wen

(10) Patent No.: US 7,024,647 B2
(45) Date of Patent: Apr. 4, 2006

(54) SYSTEM AND METHOD FOR DESIGNING A CIRCUIT WHEREIN A SINGLE TIMING ANALYSIS ENSURES ADEQUATE PERFORMANCE IN MULTIPLE APPLICATIONS

(75) Inventor: Huajun Wen, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 331 days.

(21) Appl. No.: 10/621,907

(22) Filed: Jul. 17, 2003

(65) Prior Publication Data

US 2005/0015737 A1    Jan. 20, 2005

(51) Int. Cl.
   *G06F 17/50* (2006.01)
   *G06F 9/45* (2006.01)

(52) U.S. Cl. .................................. 716/6; 716/1; 716/4

(58) Field of Classification Search ................ 716/1, 716/6, 4
See application file for complete search history.

(56) References Cited

U.S. PATENT DOCUMENTS

| | | | | | |
|---|---|---|---|---|---|
| 5,568,395 | A * | 10/1996 | Huang | ............................. | 716/4 |
| 5,845,233 | A * | 12/1998 | Fishburn | ..................... | 702/108 |
| 6,230,302 | B1 * | 5/2001 | Gabele et al. | ................. | 716/6 |
| 6,553,544 | B1 * | 4/2003 | Tanaka et al. | ................. | 716/3 |
| 6,813,753 | B1 * | 11/2004 | Jones | ............................. | 716/6 |
| 6,826,517 | B1 * | 11/2004 | Okada | ........................... | 703/2 |
| 2002/0077798 | A1 * | 6/2002 | Inoue et al. | .................. | 703/19 |
| 2003/0093763 | A1 * | 5/2003 | McConaghy | .................... | 716/2 |
| 2003/0204818 | A1 * | 10/2003 | Kashyap | ....................... | 716/1 |
| 2004/0025136 | A1 * | 2/2004 | Carelli, Jr. | ................... | 716/17 |

* cited by examiner

Primary Examiner—Vuthe Siek
Assistant Examiner—Magid Y. Dimyan
(74) Attorney, Agent, or Firm—Carr LLP; Diana R. Gerhardt

(57) ABSTRACT

A disclosed method for designing a circuit having multiple conductors includes selecting first and second circuit operating points corresponding to first and second circuit applications, respectively. A performance difference between circuit operation at the first and second circuit operating points is determined and used to compute a factor. The factor is applied to resistance values of the conductors, thereby producing modified conductor resistance values. A timing analysis of the circuit is performed using the modified conductor resistance values. A computer program product is described including computer program code for carrying out some or all of the operations of the method. An apparatus for designing the circuit includes means for applying the factor to the resistance values of the conductors and for performing the timing analysis of the circuit. A described timing analysis system includes a memory system and a central processing unit coupled to the memory system.

20 Claims, 7 Drawing Sheets

SYSTEM AND METHOD FOR DESIGNING A CIRCUIT WHEREIN A SINGLE TIMING ANALYSIS ENSURES ADEQUATE PERFORMANCE IN MULTIPLE APPLICATIONS

TECHNICAL FIELD

This invention relates generally to electronic circuits and, more particularly, to systems and methods for designing electronic circuits.

BACKGROUND OF THE INVENTION

An integrated circuit (IC) consists of electronic devices electrically connected by conductive wires called interconnect lines, or simply interconnects. The interconnects are typically patterned from conductive layers formed on or above the surface of a silicon substrate. Complex ICs include several layers or levels of interconnects spaced from one another by interlevel dielectric structures.

Integrated circuit designers typically work with building blocks including multiple components such as logic gates. In a similar manner, it is now possible for IC designers to take highly complex functional units or blocks, such as microprocessors, bus/network interfaces, and signal processors, and integrate them into an IC much like other less complex building blocks. Such functional units, commonly referred to as "cores," are becoming increasingly available.

System-on-a-chip (SOC) technology takes the core concept one step further, including all necessary circuits (e.g., cores) for a complete system, such as a cell phone or a digital camera, on a single IC. For example, an SOC for a sound-detecting device might include an audio receiver, an analog-to-digital converter, a microprocessor, memory, and input/output logic—all on a single IC.

Most complex logic circuits are synchronous systems wherein operations of multiple subcircuits or functional units are orchestrated by one or more clock signals. Such clock signals impose timing constraints on the functional units. To help ensure a manufactured IC will perform one or more functions within timing constraints established by clock signals, timing analysis or verification is performed on the functional units individually and/or collectively during the design phase.

As a result of shrinking dimensions due to technology scaling, propagation delays of logic devices continue to decline. At the same time, however, signal propagation times of interconnects (i.e., interconnect delays) have not been reduced to the same degree as reduced dimensions lead to increased resistance and larger resistance-capacitance (RC) parasitic delays. As a result, interconnect delays have become a larger fraction of signal path delays. For technologies with minimum dimensions smaller than about 0.25 microns, interconnect delays become a major performance limiter for high frequency applications. Further, interconnects are also becoming the dominant factor in determining IC power dissipation.

FIGS. 1A–1B will now be used to illustrate a problem that arises when a circuit is designed using values of environment factors (e.g., process speed, power supply voltage, temperature, and the like) adequate to meet the performance requirements of a first application, and the values of the environment factors are subsequently changed to meet the performance requirements of a new application. FIG. 1A is a diagram of a first circuit path 100 including only devices (e.g., transistors) 102 between a pair of cycle boundary latches 104A and 104B, where a signal launched by the latch 104A is captured by the latch 104B one cycle of a clock signal later. FIG. 1B is a diagram of a second circuit path 106 including two interconnect lines (i.e., interconnects) 108A and 108B and a buffer 110 between another pair of cycle boundary latches 112A and 112B, where a signal launched by the latch 112A is captured by the latch 112B during the next cycle of the clock signal. The buffer 110 is included in FIG. 1B only to reflect the need to maintain signal integrity along the circuit path 106.

Environment factors influencing propagation times of signals traveling along the circuit paths 100 and 106 include process speed, power supply voltage, and temperature. For example, when process speed and/or power supply voltage is increased or decreased, the signal propagation time along the circuit path 100 expectedly decreases or increases, respectively, according to a process technology used to manufacture the devices 102. On the other hand, the signal propagation times (i.e., delay times) of the interconnects 108A–108B of FIG. 1B remain substantially constant, and largely determine the delay time of the path 106. As a result, the delay time along the path 106 remains substantially constant.

When a circuit including the paths 100 and 106 is designed using values of environment factors adequate to meet the performance requirements of a first application, and the values of the environment factors are subsequently changed to meet the performance requirements of a new application, the above mentioned problem arises. For example, when process speed and/or power supply voltage is increased, the signal propagation time of the circuit path 100 of FIG. 1A is expectedly reduced, allowing higher speed operation of the circuit. However, the substantially unchanged signal propagation time of the circuit path 106 of FIG. 1B may prevent higher speed operation of the circuit.

It would thus be advantageous to have a system and method for designing a circuit including multiple conductors wherein timing analysis performed at an operating point associated with a first application would also ensure adequate performance in a known or projected second application.

SUMMARY OF THE INVENTION

A disclosed method for designing a circuit having multiple conductors includes selecting a first operating point corresponding to a first circuit application and a second operating point corresponding to a second circuit application. A performance difference between circuit operation at the first and second circuit operating points is determined and used to compute a factor. The factor is applied to resistance values of the conductors, thereby producing modified conductor resistance values. A timing analysis of the circuit is performed using the modified conductor resistance values. A computer program product is described including computer program code for carrying out some or all of the operations of the method.

A disclosed apparatus for designing the circuit includes means for applying the factor to the resistance values of the conductors and for performing the timing analysis of the circuit. A timing analysis system is described including a memory system and a central processing unit (CPU) coupled to the memory system. The memory system includes software including instructions for applying the factor to resistance values of the conductors, and a timing analysis tool including instructions for performing the timing analysis of the circuit. The CPU is configurable to fetch instructions from the memory and to execute the instructions.

BRIEF DESCRIPTION OF THE DRAWINGS

The invention may be understood by reference to the following description taken in conjunction with the accompanying drawings, in which like reference numerals identify similar elements, and in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or some combination thereof. In a preferred embodiment, however, the functions are performed by a processor, such as a computer or an electronic data processor, in accordance with code, such as computer program code, software, and/or integrated circuits that are coded to perform such functions, unless indicated otherwise.

Figure 2:
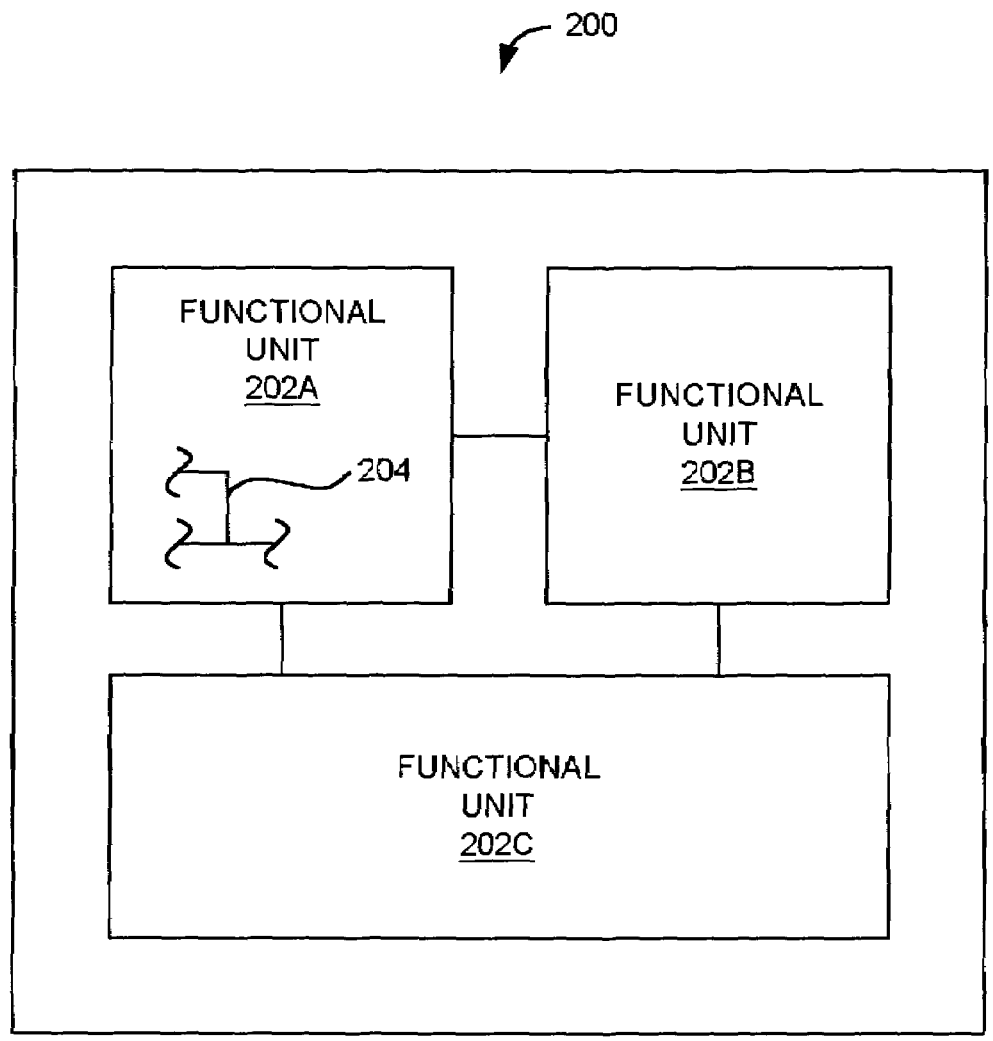
FIG. 2 is a diagram of one embodiment of a system-on-a-chip (SOC) including multiple functional blocks, wherein each of the functional blocks includes devices connected by electrically conductive interconnects.

FIG. 2 is a diagram of one embodiment of a system-on-a-chip (SOC) 200 including multiple functional blocks 202A–202C. Each of the functional blocks 202A–202C is a relatively complex circuit that performs one or more functions. As indicated in FIG. 2, the functional blocks 202A–202C are interconnected and communicate with one another to accomplish a desired function of the SOC 200.

In general, each of the functional blocks 202A–202C includes devices connected by electrically conductive wires called traces or interconnects. Exemplary interconnects of the functional block 202A are labeled 204 in FIG. 2.

Figure 3:
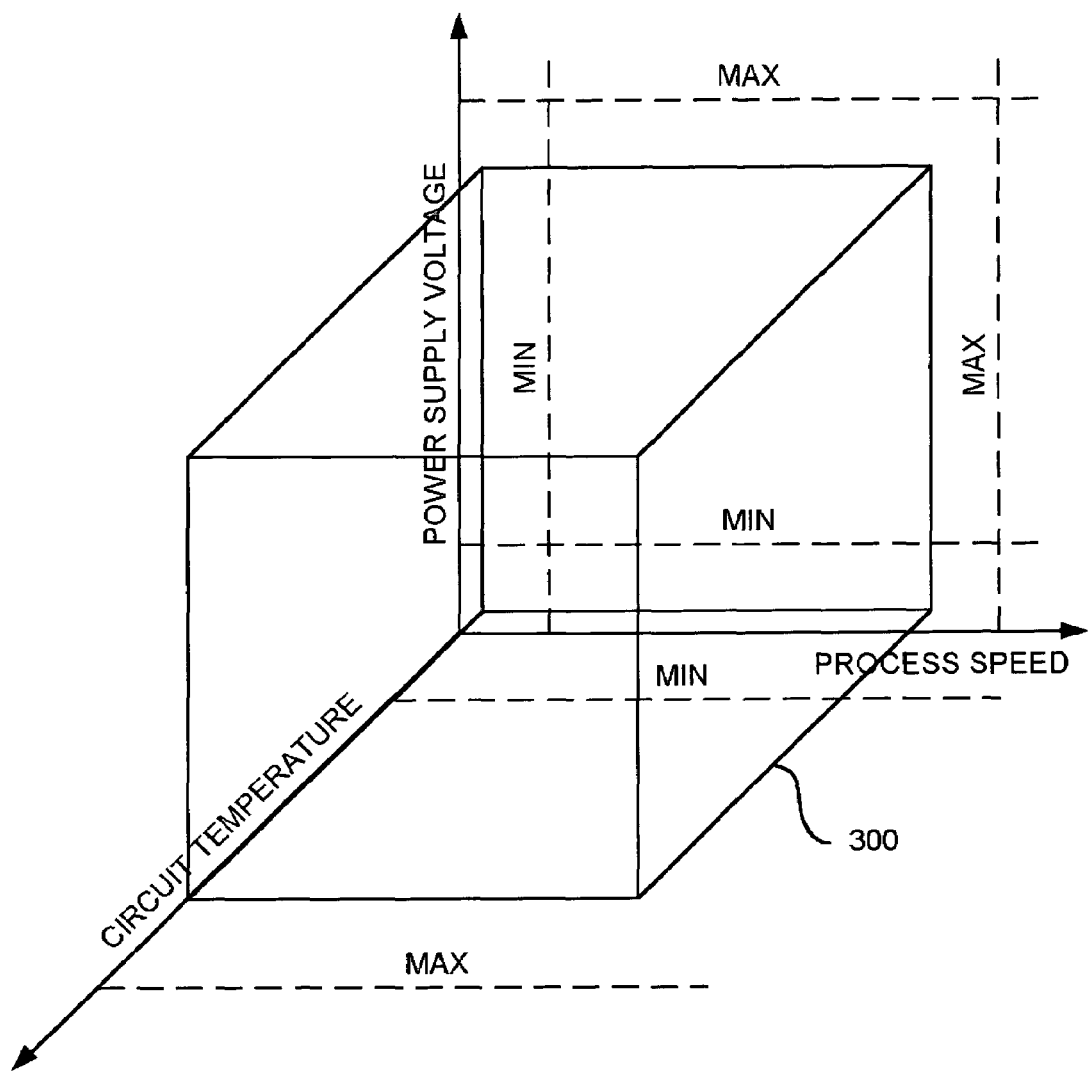
FIG. 3 is a diagram of one embodiment of a 3-dimensional environment space in which the functional blocks of the SOC of FIG. 2 operate, and wherein the environment space exists in a system with a process speed dimension, a power supply voltage dimension, and a circuit temperature dimension.

FIG. 3 is a diagram of one embodiment of a 3-dimensional environment space 300 in which the functional blocks 202A–202C of the SOC 200 of FIG. 2 operate. In the embodiment of FIG. 3, the environment space 300 exists in a system with a process speed dimension, a power supply voltage dimension, and a circuit temperature dimension.

Figure 1A:
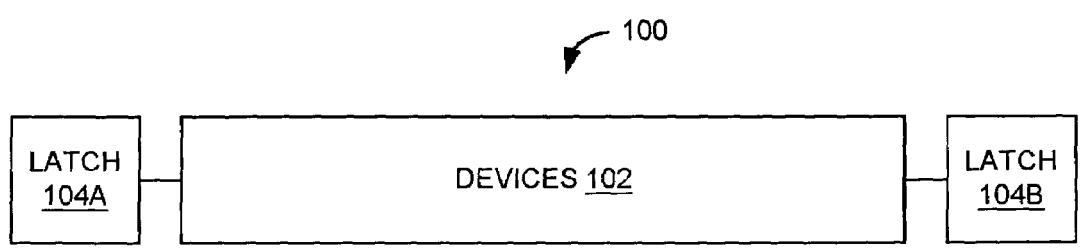
FIG. 1A is a diagram of a first circuit path including only devices (e.g., transistors) between a pair of cycle boundary latches.
Figure 1B:
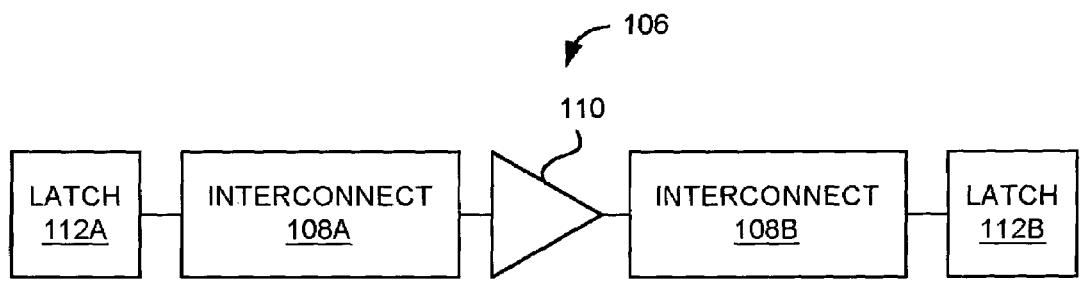
FIG. 1B is a diagram of a second circuit path including two interconnect lines (i.e., interconnects) and a buffer between another pair of cycle boundary latches.
Figure 4:
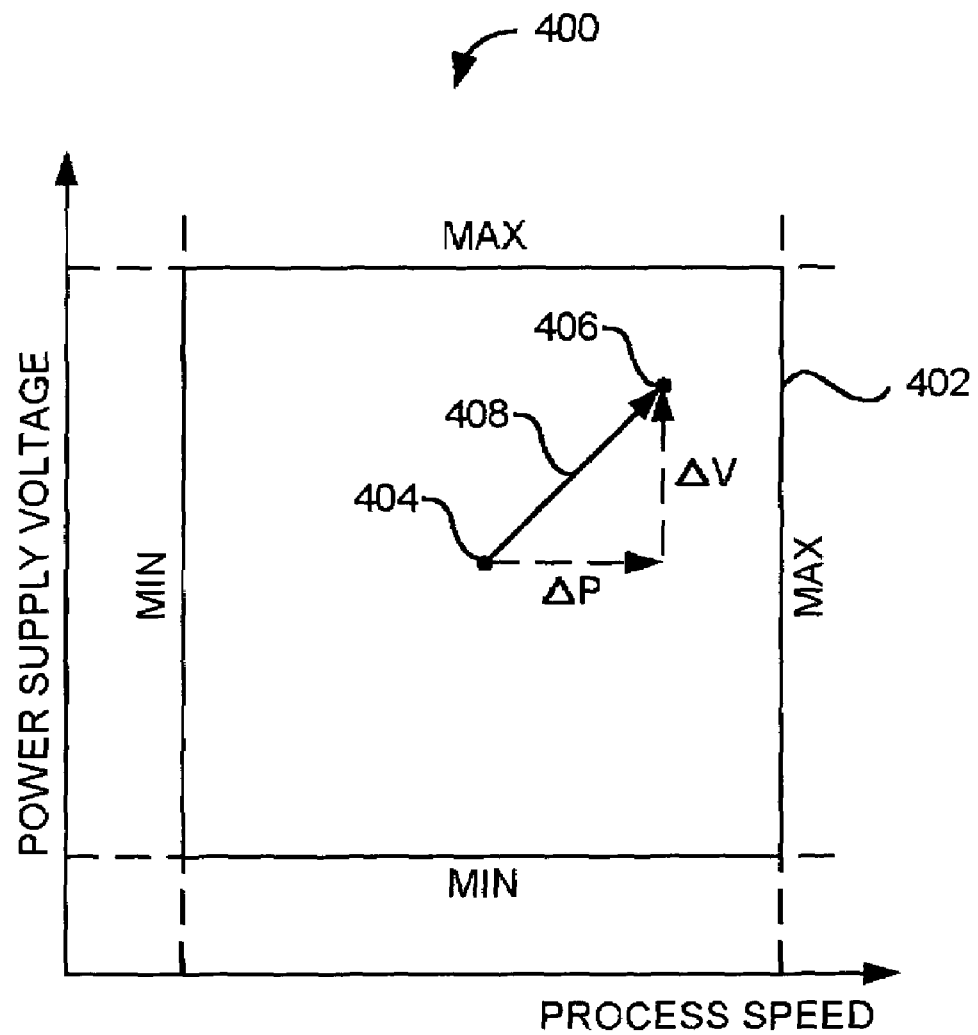
FIG. 4 is a diagram of a temperature plane of the 3-dimensional environment space of FIG. 3 resulting from selection of a circuit operating temperature of the functional blocks of FIG. 2, wherein an environment window exists in the temperature plane, and wherein a first operating point of one of the functional units is located at or near a center of the environment window, and wherein a second operating point of the functional unit is located in the environment window above and to the right of the first operating point.

In a typical design process used to design the functional blocks 202A–202C of the SOC 200 of FIG. 1, an operating temperature of the functional blocks 202A–202C is first selected. FIG. 4 is a diagram of a temperature plane 400 of the 3-dimensional environment space 300 of FIG. 3 resulting from selection of a circuit operating temperature of the functional blocks 202A–202C of FIG. 2. In FIG. 4, an environment window 402 exists in the temperature plane 400 bounded by minimum and maximum process speeds and minimum and maximum power supply voltages.

A first operating point 404 is selected within the environment window 402 corresponding to the SOC 200 application of the functional blocks 202A–202C. In general, the first operating point 404 is selected dependent upon performance requirements of the SOC 200 application of the functional blocks 202A–202C (e.g., speed, electrical power dissipation, and the like). In FIG. 4, the operating point 404 is located at or near a center of the environment window 402, and considered a "nominal" operating point. In general, the operating point 404 may be located anywhere in the environment window 402.

There can also be other applications for one or more of the functional blocks 202A–202C of FIG. 2 having different performance requirements. A second operating point 406 is shown in FIG. 4 corresponding to a second application of the functional block 202A. The second application may be known at the same time as the first application, or may be a projected application. The second operating point 406 is, in general, selected dependent upon the performance requirements of the second application.

In FIG. 4, the second operating point 406 exists in the environment window 402 in the temperature plane 400. It is noted that the second operating point 406 may exist in another environment window in a different temperature plane.

The two major digital logic circuit performance factors are speed (maximum frequency of a synchronizing clock signal) and electrical power dissipation. Digital logic circuits may be manufactured using any one of several available process technologies. In a complementary metal oxide semiconductor (CMOS) digital logic circuit manufactured using a selected process technology, the speed and electrical power dissipation of the circuit are directly related—higher circuit speed results in proportionally higher electrical power dissipation. Selecting a (more expensive) higher performance process technology with smaller devices (i.e., devices with smaller physical dimensions) may allow the same CMOS circuit to operate faster and/or with reduced electrical power dissipation.

In general, within a selected process technology, both the speed and power dissipation of a CMOS circuit are directly proportional to process speed and power supply voltage, and inversely proportional to temperature. In this example, it is assumed that the selected process technology stays the same. In FIG. 4, the fact that a positive change in process speed "ΔP" and a positive change in power supply voltage "ΔV" exists between the first operating point 404 and the second operating point 406 indicates the speed requirement of the second application is greater than the SOC 200 application, and the corresponding increased power dissipation is acceptable.

In FIG. 4, a performance difference between operation at the second operating point 406 and the first operating point 404 is indicated by a vector 408 directed from the first operating point 404 to the second operating point 406.

A numerical performance difference factor may be estimated using relationships between performance and process speed, voltage and temperature, the changes in process speed, power supply voltage, and circuit temperature. The performance difference factor is generally a value "k" such that a performance at the second operating point 406 is k times the performance at the first operating point 404. That is, the performance difference factor k is a ratio of the performance at the second operating point 406 to the performance at the first operating point 404.

For example, tests performed on CMOS circuits manufactured using a given process technology may indicate the following relationship between device propagation times (i.e., delay times) and power supply voltage: delay1/delay2=$V_{DD}2/V_{DD}1$, where delay1 is the device delay time at power supply voltage $V_{DD}1$ and delay2 is the device delay time at power supply voltage $V_{DD}2$. Such relationships may be used to determine the performance difference factor k.

The performance difference factor k may also be determined by simulating operation of the functional block 202A. For example, a technology model library may be used that specifies device speeds at various environmental conditions. A first performance level may be determined at the first operating point 404, and a second performance level may be determined at the second operating point 406. The first and second performance levels may be used to determine the value k.

In general, interconnects have signal propagation times (i.e., delay times) dependent on the electrical characteristics of the interconnects, including resistance and capacitance. If the interconnects 204 of the functional block 202A are designed to meet the lower performance requirements of the SOC 200 application, an upper limit on performance established by the substantially constant delay times of the interconnects 204 may prevent the functional block 202A from operating at the higher performance requirement of the second application.

In order to ensure that the signal propagation times of the interconnects 204 will not prevent the functional block 202A from operating at the higher performance requirement of the second application, the resistance values of the interconnects 204 are modified. The performance difference between operation at the second operating point 406 and the first operating point 404 is used to compute a factor. (A factor greater than 1 is referred to as an "uplift" factor, and a factor less than 1 is called a "downshift" factor.) The factor is applied to the resistance values of the interconnects 204 of the functional block 202A, thereby producing modified resistance values. The modified resistance values are used to perform a timing analysis of the functional block 202A at the first operating point 404.

In general, the performance difference factor k described above is used to compute a second factor "r" to be applied to the resistance values of the interconnects 204 of the functional block 202A. For example, the factor r may be computed using r=a(k), where "a" can, in general, be any value. The value a may be termed a "scaling value." The value of a may, for example, be set to 1 such that r=k and the resistance values of the interconnects 204 scale directly with the difference in performance between the second operating point 406 and the first operating point 404.

For example, assume the performance difference factor k associated with the vector 408 in FIG. 4 is determined to be 1.5, and r=k. The factor 1.5 may be applied to the resistance values of the interconnects 204 of the functional block 202A by, for example, multiplying the resistance values of the interconnects 204 of the functional block 202A by the factor 1.5. The resulting increased resistance values are used to perform a timing analysis of the functional block 202A at the first operating point 404. If timing constraints are not met, the interconnects 204 of the functional block 202A may be modified to meet the timing constraints. In any case, using the increased resistance values advantageously ensures that the interconnects 204 of the functional block 202A are not under-designed such that they establish an upper performance limit that prevents the functional block 202A from operating at the higher performance requirement of the second application without, for example, allowing a longer cycle time (i.e., period) of a clock signal to complete operations in the second application.

Figure 5:
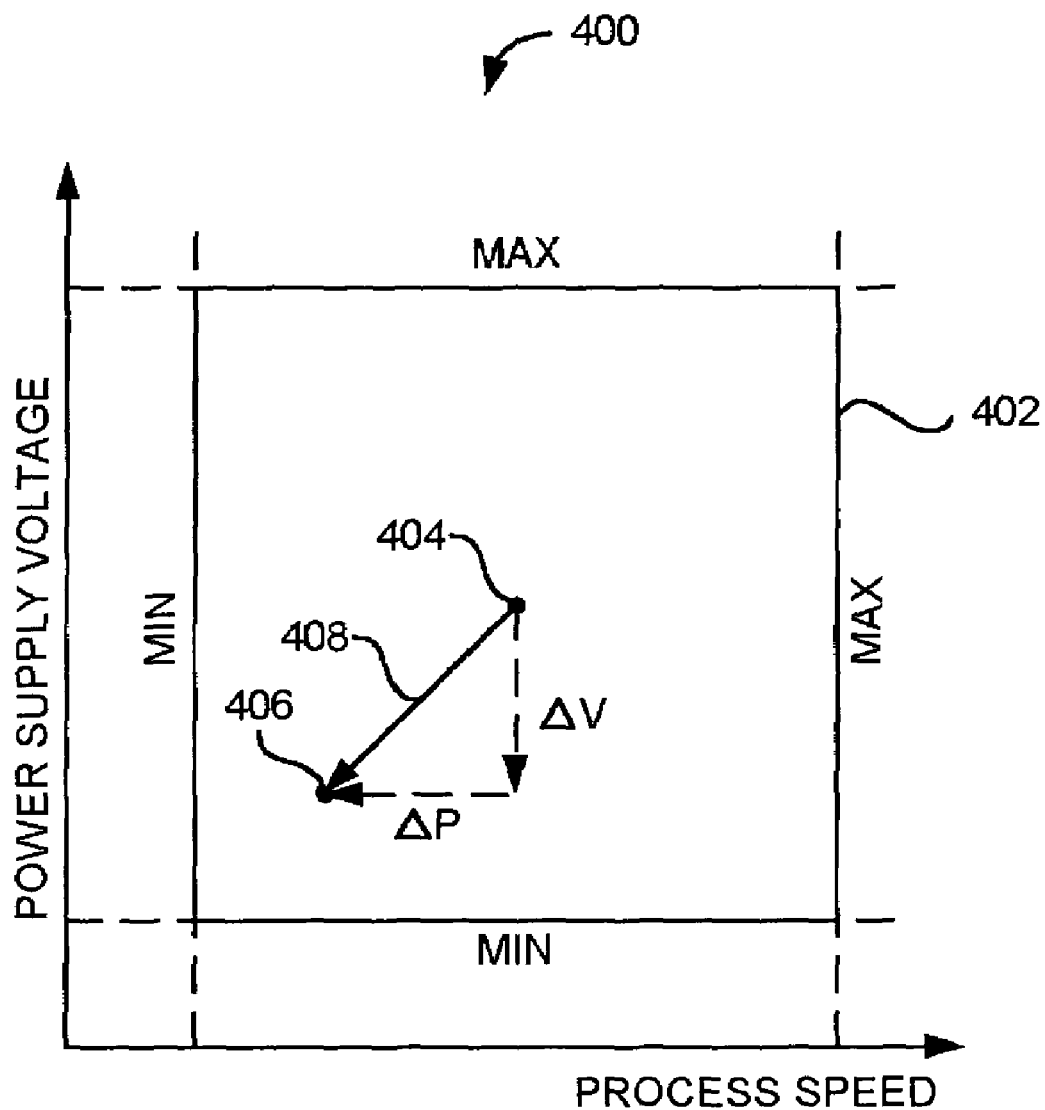
FIG. 5 is a diagram of the temperature plane of FIG. 4 wherein the second operating point has been moved below and to the left of the first operating point.

FIG. 5 is a diagram of the temperature plane 400 of FIG. 4 wherein the second operating point 406 has been moved below and to the left of the first operating point 404. The vector 408 is again directed from the first operating point 404 to the second operating point 406, and indicates a performance difference between operation at the second operating point 406 and the first operating point 404.

In FIG. 5, negative values of the change in process speed ΔP and the change in power supply voltage ΔV indicate the speed requirement of the second application is less than the SOC 200 application. The power dissipation is also expectedly reduced.

For example, assume the performance difference factor k associated with the vector 408 in FIG. 5 is determined to be 0.5, and r=k. The factor 0.5 may be applied to the resistance values of the interconnects 204 of the functional block 202A by, for example, multiplying the resistance values of the interconnects 204 of the functional block 202A by the factor 0.5. The resulting reduced resistance values are used to perform a timing analysis of the functional block 202A at the first operating point 404. If timing constraints are not met, the interconnects 204 of the functional block 202A may be modified. In any case, using the decreased resistance values advantageously ensures that the interconnects 204 of the functional block 202A are not over-designed such that, for example, additional layers of interconnect are unnecessarily required in the second application.

Figure 6:
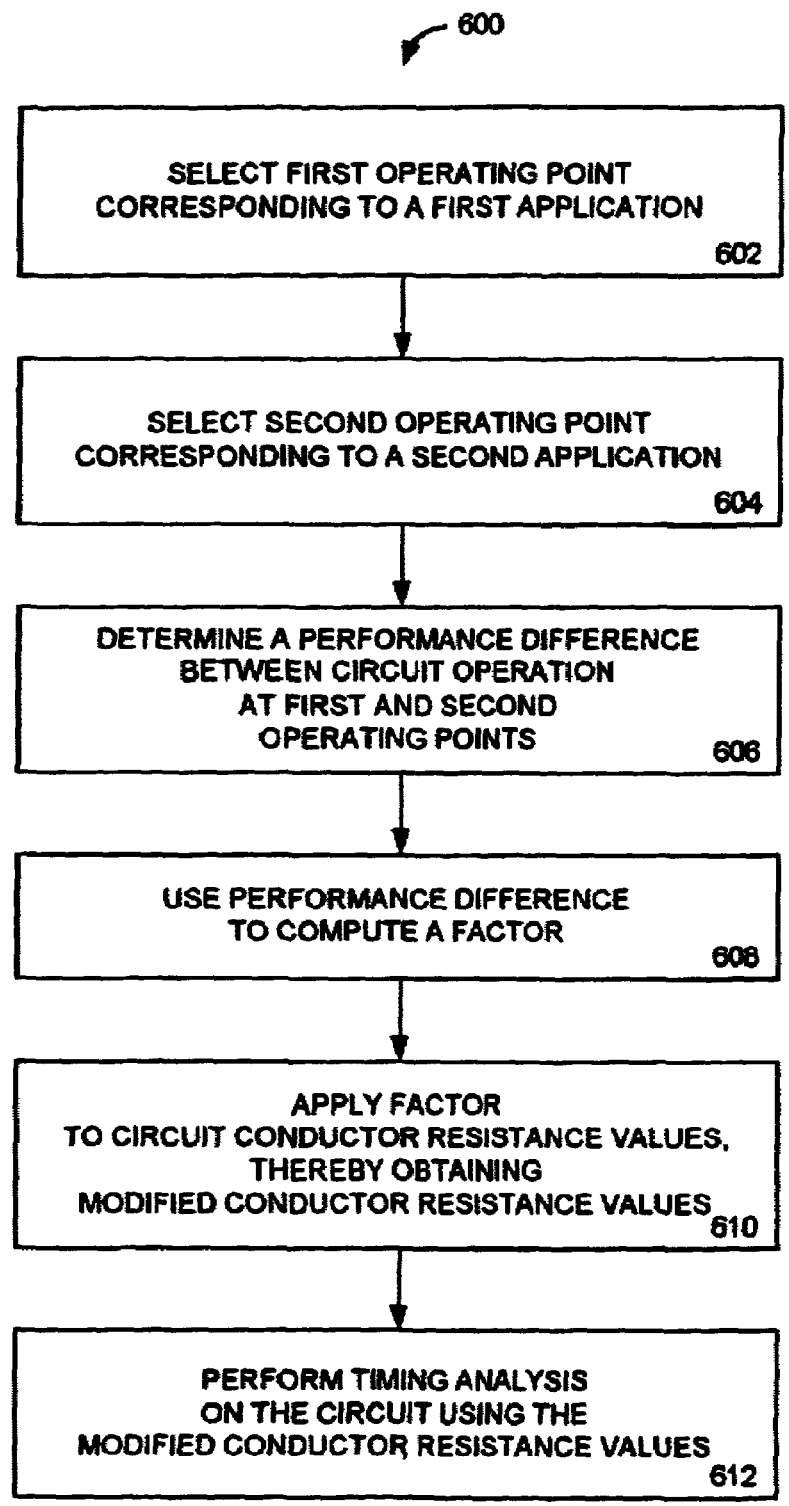
FIG. 6 is a flow chart of one embodiment of a method for designing a circuit including multiple conductors, wherein the method includes several operations.

FIG. 6 is a flow chart of one embodiment of a method 600 for designing a circuit including multiple conductors (e.g., the functional block 202A of FIG. 2). The method 600 may be used, for example, to design one or more of the functional blocks 202A–202C of the SOC 200 of FIG. 2. During a first operation 602 of the method 600, a first operating point (e.g., the first operating point 404 of FIG. 4) is selected corresponding to a first application (e.g., use of the functional block 202A in the SOC 200 of FIG. 2 as described above).

During an operation 604, a second operating point (e.g., the second operating point 406 of FIG. 4) is selected corresponding to a second application (e.g., use of the functional block 202A in an application other than the SOC 200 of FIG. 2). A performance difference (e.g., a performance difference factor associated with the vector 408 in FIGS. 4 and 5) is determined between circuit operation at the first and second operating points during an operation 606.

During an operation 608, the performance difference is used to compute a factor (e.g., the factor r described above). The factor is applied to resistance values of the conductors, thereby producing modified conductor resistance values, during an operation 610. For example, as described above, the factor r may be applied to the resistance values of the conductors by multiplying the resistance values of the conductors by the factor r, thereby producing the modified conductor resistance values.

During an operation 612, a timing analysis of the circuit is performed using the modified conductor resistance values. The timing analysis is performed to ensure the circuit will operate correctly in the presence of one or more timing constraints. If the timing constraints are not met, the conductors may be modified. In any case, using the modified resistance values advantageously ensures that the conductors are not over-designed or under-designed as described above. When a result of the timing analysis verifies the circuit will operate correctly in the presence of the one or more timing constraints, the circuit will also likely meet performance requirements of the second application.

It is noted that the method 600 may be applied to each of multiple circuits of a system-on-a-chip (SOC). For example, the method 600 may also be applied to the functional blocks 202B and 202C of the SOC 200 of FIG. 2. The resulting factors r may be greater than 1 for some circuits and less than 1 for others.

Figure 7:
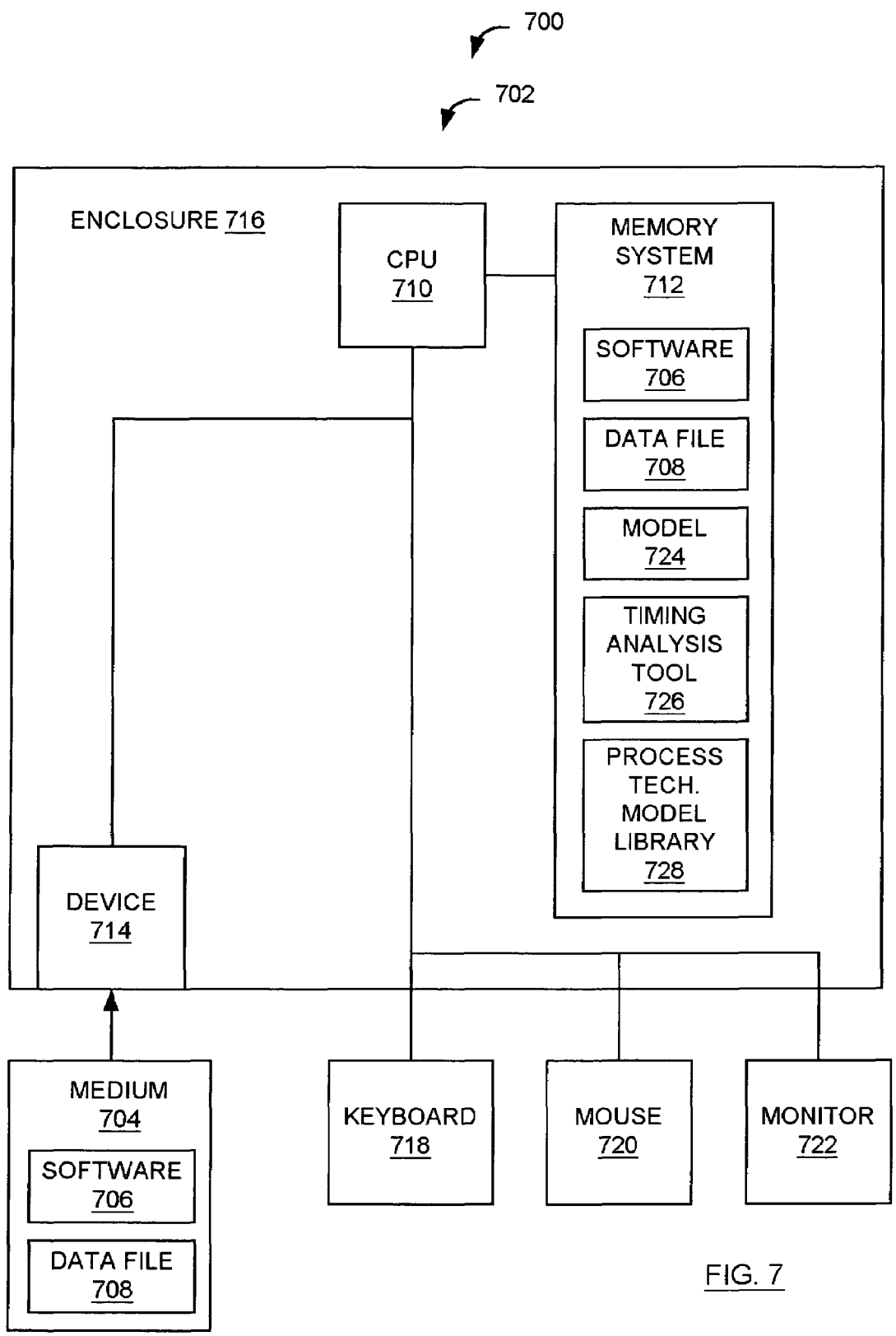
FIG. 7 is a diagram of a timing analysis system for carrying out some or all of the operations of the method of FIG. 6.

FIG. 7 is a diagram of a timing analysis system 700 for carrying out some or all of the operations of the method 600 of FIG. 6 described above. In the embodiment of FIG. 7, the timing analysis system 700 includes a computer system 702 and a medium 704 having computer software 706 and/or a data file 708 stored thereon. The computer system 702 includes a central processing unit (CPU) 710 coupled to a memory system 712 and to a device 714, all of which are located in an enclosure 716. The CPU 710 is also coupled to a keyboard 718, a mouse 720, and a monitor 722.

The software 706 includes computer program code for carrying out some or all of the operations of the method 600 of FIG. 6. In one embodiment, the data file 708 includes the factor (e.g., the factor r) to be applied to resistance values of circuit conductors. Alternately, the data file 708 may include modified conductor resistance values for circuit conductors.

As indicated in FIG. 7, the software 706 and/or the data file 708 may also reside in the memory system 712. For example, the device 714 may transfer the software 706 from the medium 704 to the memory system 712. The CPU 710 may execute the computer program code of the software 706, thereby producing the data file 708 in the memory system 712. The device 714 may be used to transfer the data file 708 from the memory system 712 to the medium 704.

As indicated in FIG. 7, a model 724, a timing analysis tool 726, and a process technology model library 728 also reside in the memory system 712. In general, the model 724 includes one or more computer files describing the components of an electronic circuit and their interconnections. The model 724 may be, for example, a layout file including component placement information used to manufacture the electronic circuit. The timing analysis tool 726 is computer software including computer program code for carrying out the timing analysis during operation 612 of the method 600 described above. The process technology model library 728 includes functional and/or electrical data regarding the electronic circuit components needed to perform the timing analysis.

When the timing analysis system 700 is used to carry out the operations 610 and 612 of the method 600, the CPU 710 executes the computer program code of the software 706 and the timing analysis tool 726. When the data file 708 includes the factor (e.g., the factor r) to be applied to resistance values of circuit conductors, the CPU 710 may access the process technology model library 728 under the control of the software 706 to obtain conductor resistance values (or data used to compute the conductor resistance values), and apply the factor as described above to compute the modified conductor resistance value. Under the control of the software 706 and/or the timing analysis tool 726, the CPU 710 may perform the timing analysis using the modified conductor resistance values.

When the data file 708 includes the modified conductor resistance values for the circuit conductors, the CPU 710 may access the data file 708 under the control of the software 706 to obtain the modified conductor resistance values, and perform the timing analysis using the modified conductor resistance values under the control of the software 706 and/or the timing analysis tool 726.

As described above, the timing analysis is performed to ensure the circuit will operate correctly in the presence of one or more timing constraints. If the model 724 does not meet timing constraints during the timing analysis due to signal propagation times (i.e., delay times) of circuit conductors, a user of the timing analysis system 700 preferably uses the computer system 702 to modify various physical aspects of the circuit conductors of the model 724, as well as architectural and logical functions, until the timing constraints are met.

In any case, as described above, using the modified resistance values advantageously ensures that the circuit conductors are not over-designed or under-designed. When a result of the timing analysis verifies the circuit will operate correctly in the presence of the timing constraints, the circuit will also likely meet performance requirements of the second application.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method for designing a circuit comprising a plurality of conductors, the method comprising:

selecting a first operating point corresponding to a first circuit application;

selecting a second operating point corresponding to a second circuit application;

determining a performance difference between circuit operation at the first and second operating points;

using the performance difference to compute a factor;

applying the factor to resistance values of the conductors, thereby producing modified conductor resistance values; and performing a timing analysis of the circuit at the first operating point using the modified conductor resistance values, thereby producing a result indicative of whether the circuit will operate correctly at the second operating point.

2. The method as recited in claim 1, wherein the result of the timing analysis indicates whether the circuit will operate correctly in the presence of one or more timing constraints of the second circuit application.

3. The method as recited in claim 2, wherein in the event the result of the timing analysis indicates the circuit will operate correctly in the presence of the one or more timing constraints, the circuit will also expectedly meet performance requirements of the second circuit application.

4. The method as recited in claim 1, wherein the circuit is a functional block of a system-on-a-chip (SOC).

5. The method as recited in claim 1, wherein the conductors are interconnects.

6. The method as recited in claim 1, wherein the first and second circuit operating points exist in an environment space defined by a plurality of variable operating parameters.

7. The method as recited in claim 6, wherein the environment space is a 3-dimensional space having a process speed dimension, a power supply voltage dimension, and a circuit temperature dimension.

8. The method as recited in claim 7, wherein the selecting the first operating point comprises:
selecting a circuit temperature, thereby defining a circuit temperature plane in the 3-dimensional environment space; and
selecting a first operating point corresponding to a first circuit application within an environment window existing in the circuit temperature plane.

9. The method as recited in claim 8, wherein the first operating point is located at or near a center of the environment window.

10. The method as recited in claim 8, wherein the selecting the second operating point comprises:
selecting a second operating point corresponding to a second circuit application within the environment window.

11. The method as recited in claim 10, wherein the second operating point is located at or near an outer edge of the environment window.

12. The method as recited in claim 1, wherein the determining the performance difference comprises:
computing a performance difference factor as a ratio of a performance of the circuit at the second operating point to the performance of the circuit at the first operating point.

13. The method as recited in claim 12, wherein the using the performance difference to compute the factor comprises:
determining a factor by selecting a scaling value and multiplying the performance difference factor by the scaling value.

14. A circuit designed using the method of claim 1.

15. The method as recited in claim 1, wherein the first and second operating points are defined by corresponding values of a plurality of variable operating parameters.

16. The method as recited in claim 15, wherein the variable operating parameters include process speed, power supply voltage, and circuit temperature.

17. A computer program product for designing a circuit comprising a plurality of conductors, the computer program product having a medium with a computer program embodied thereon, the computer program comprising:
computer program code for applying a factor to resistance values of the conductors, thereby producing modified conductor resistance values, wherein the factor is computed dependent upon a determined performance difference between operation of the circuit at a selected first operating point, corresponding to a first circuit application, and a selected second operating point corresponding to a second circuit application; and
computer program code for performing a timing analysis of the circuit at the first operating point using the modified conductor resistance values, thereby producing a result indicative of whether the circuit will operate correctly at the second operating point.

18. The computer program product as recited in claim 17, wherein the computer program code for applying the factor to the resistance values of the conductors comprises:
computer program code for accessing a process technology model library to obtain data indicative of the resistance values of the conductors.

19. An apparatus for designing a circuit comprising a plurality of conductors, the apparatus comprising:
means for applying a factor to resistance values of the conductors, thereby producing modified conductor resistance values, wherein the factor is computed dependent upon a determined performance difference between operation of the circuit at a selected first operating point, corresponding to a first circuit application, and a selected second operating point corresponding to a second circuit application; and
means for performing a timing analysis of the circuit at the first opening point using the modified conductor resistance values, thereby producing a result indicative of whether the circuit will operate correctly at the second operating point.

20. A timing analysis system, comprising:
a memory system, comprising:
software including instructions for applying a factor to resistance values of the conductors, thereby producing modified conductor resistance values; wherein the factor is computed dependent upon a determined performance difference between operation of the circuit at a selected first operating point, corresponding to a first circuit application, and a selected second operating point corresponding to a second circuit application;
a timing analysis tool including instructions for performing a timing analysis of the circuit at the first operating point using the modified conductor resistance values, thereby producing a result indicative of whether the circuit will operate correctly at the second operating point; and
a central processing unit coupled to the memory system and configurable to fetch instructions from the memory and to execute the instructions.

* * * * *